United States Patent
Moller et al.

(10) Patent No.: US 7,102,562 B2
(45) Date of Patent: Sep. 5, 2006

(54) RADIO FREQUENCY ANECHOIC CHAMBER WITH IMPROVED TEST STAND

(75) Inventors: Paul J. Moller, Lake Zurich, IL (US); Eric L. Krenz, Crystal Lake, IL (US); James P. Phillips, Lake In The Hills, IL (US); Hugh K. Smith, Palatine, IL (US)

(73) Assignee: Motorola, Inc., Schaumburg, IL (US)

( * ) Notice: Subject to any disclaimer, the term of this patent is extended or adjusted under 35 U.S.C. 154(b) by 290 days.

(21) Appl. No.: 10/805,996

(22) Filed: Mar. 22, 2004

(65) Prior Publication Data

US 2005/0206550 A1   Sep. 22, 2005

(51) Int. Cl.
*G01R 29/08* (2006.01)
*G01S 7/40* (2006.01)

(52) U.S. Cl. ............... 342/4; 342/1; 342/173
(58) Field of Classification Search .......... 342/4
See application file for complete search history.

(56) References Cited

U.S. PATENT DOCUMENTS

| | | | | |
|---|---|---|---|---|
| 3,806,943 A * | 4/1974 | Holloway | .................... | 343/703 |
| 4,274,048 A | 6/1981 | Tricoles et al. | | |
| 4,879,560 A * | 11/1989 | McHenry | .................... | 342/165 |
| 4,947,175 A * | 8/1990 | Overholser | .................. | 342/165 |
| 4,968,983 A | 11/1990 | Maeda | | |
| 4,990,923 A * | 2/1991 | Delfeld | ........................ | 342/165 |
| 5,028,928 A | 7/1991 | Vidmar et al. | | |
| 5,099,244 A * | 3/1992 | Larson | ........................ | 342/165 |
| 5,134,405 A * | 7/1992 | Ishihara et al. | ................. | 342/1 |
| 5,812,080 A * | 9/1998 | Takahashi | ....................... | 342/4 |
| 5,936,568 A * | 8/1999 | Berg et al. | ..................... | 342/1 |
| 6,252,541 B1 * | 6/2001 | James | ......................... | 342/165 |
| 6,329,953 B1 | 12/2001 | McKivergan | | |

FOREIGN PATENT DOCUMENTS

WO     WO 03/012465 A1     3/2003

OTHER PUBLICATIONS

Marion Baggett & Tom Thomas; "Obtaining High Quality RCS Measurements with a Vary Large Foam Column"; 6 pages.
Emerson & Cuming Microwave Products; "ECCOSORB VHP-NRL: Very High Performance Broadband Pyramidal Absorber"; No. EB-100 Technical Bulletin; 5 pages.

* cited by examiner

*Primary Examiner*—Thomas H. Tarcza
*Assistant Examiner*—Matthew M. Barker
(74) *Attorney, Agent, or Firm*—Sylvia Chen (57) ABSTRACT

A radio frequency anechoic test chamber (100) includes a test stand (118) that includes a relatively small diameter, mechanically robust, telescoping lower vertical support column (202), a large diameter thin walled middle vertical support column (204) that includes a sheet or coating of absorbing material (224) disposed proximate the circumference of the thin walled middle support column, (204) and an upper support member (206). The radio frequency anechoic test chamber provides improved ripple performance that allows more accurate measurements of the gain pattern of radio frequency equipment.

26 Claims, 6 Drawing Sheets

RADIO FREQUENCY ANECHOIC CHAMBER WITH IMPROVED TEST STAND

FIELD OF THE INVENTION

The present invention relates in general to radio frequency anechoic chambers.

BACKGROUND OF THE INVENTION

Radio frequency anechoic chambers are used to provide controlled repeatable environments for performing radio frequency radiation tests. Radio frequency anechoic chambers are meant to approximate an unbounded region of free space for electromagnetic waves and are meant to provide an environment in which radio frequency radiation tests can be made without introducing the errors caused by reflected waves or standing waves.

One type of test performed in radio frequency anechoic chambers is the measurement of power radiated from a piece of radio frequency equipment (termed the Equipment Under Test, EUT) as a function of polar and azimuth angle. Such a test allows a complete characterization of the spatial dependence of electromagnetic waves radiated by the EUT. The floor, ceiling and walls of radio frequency anechoic test chambers are tiled with radio frequency absorbers that are provided to substantially diminish reflections and standing waves. The EUT is supported away from the absorbing walls, ceiling and floor, usually in the center of the chamber, in order to make measurements. Elevating the EUT with a support also allows a measurement antenna to be moved so as to view the EUT from a wide range (nearly 180 degrees) of polar angle. To avoid large disturbances of the radio frequency fields emitted by the EUT, the support is made from dielectric materials as opposed to metal. However even a dielectric support perturbs radio frequency fields and can cause reflections that distort measurements made in radio frequency anechoic chambers.

One way to measure the level of unwanted reflections of radio frequency waves in an anechoic chamber equipped with an EUT support, and configured for measuring radiated radio frequency wave power as a function of polar angle, is to install a transmitting antenna that radiates uniformly as a function of polar angle (e.g., a horizontally oriented dipole) on the EUT support in the anechoic chamber and move a receiving antenna (also called a probe) over a large range of polar angles with respect to the transmitting antenna while measuring the power received by the receiving antenna. In an ideal radio frequency anechoic test chamber with an ideal support, there would be no variation in the measured field. The variation that occurs is termed "ripple". The ripple can in part be caused by the support creating a disturbance of the radio frequency field emitted from the transmitting antenna.

In designing the support for the EUT, aside from the goal of reducing the disturbance of radio frequency fields in the anechoic chamber caused by the support, the support must also be made mechanically robust enough to support the EUT and all other equipment that is to be positioned with the EUT on the support. Achieving high mechanical robustness suggest that the support be made of thick section materials; however using thick section materials would tend to increase disturbance of radio frequency fields by the support. An additional requirement is that the support interfere as little as possible with movement of a receiving antenna in the anechoic chamber through a large range of polar angle with respect to the EUT supported on the support.

There is a need for a radio frequency anechoic test chamber with an EUT support, that meets the design criteria set forth above.

BRIEF DESCRIPTION OF THE FIGURES

The present invention will be described by way of exemplary embodiments, but not limitations, illustrated in the accompanying drawings in which like references denote similar elements, and in which.

DETAILED DESCRIPTION

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

Figure 1:
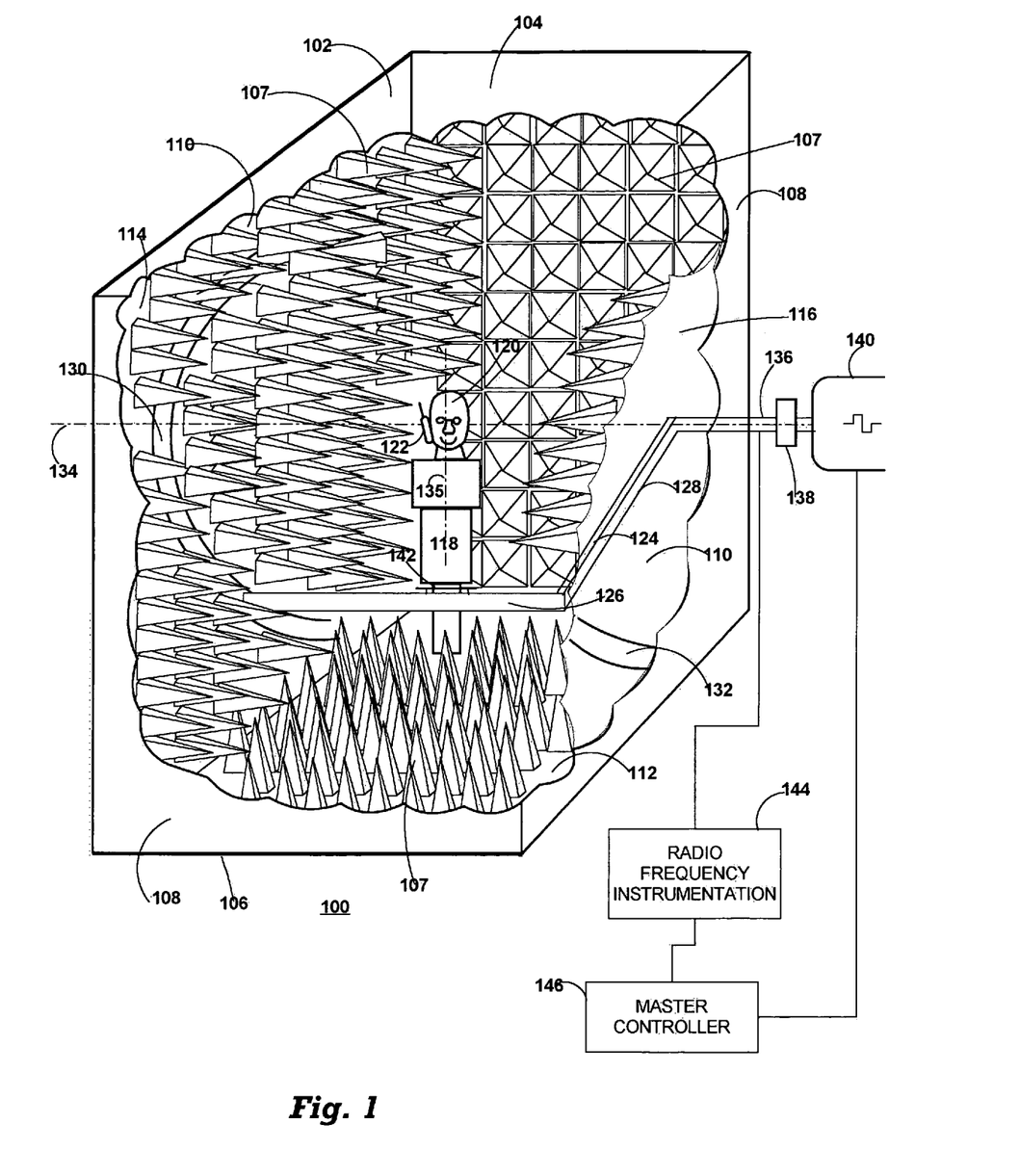
FIG. 1 is a cut-away view of a radio frequency anechoic test chamber according to an embodiment.

FIG. 1 is a cut-away view of a radio frequency anechoic test chamber 100 according to an embodiment. The anechoic test chamber 100 is bounded by a metal outer skin 102. The metal outer skin 102 serves to block radio frequency or other electromagnetic waves emanating from outside the test chamber 100 from entering the test chamber 100 and corrupting measurements taken in the chamber 100. In the embodiment shown in FIG. 1 the anechoic test chamber 100 is box shaped, and the metal outer skin 102 comprises a ceiling 104, a floor 106, and four walls 108 (two of which are partially visible in FIG. 1). Alternatively, the anechoic test chamber 100 has a different shape such as another prism shape (e.g., pentagonal, hexagonal prism), cylindrical or hemispherical, for example.

Within the metal skin 102 is an inner enclosure 110 that is made from plywood or some other material. A second metal skin (not shown) is optionally included inside the inner enclosure 110. In the embodiment shown in FIG. 1, the inner enclosure 110 comprises a floor 112, a ceiling (not visible in FIG. 1), a left wall 114, a right wall 116, a back wall (not visible in FIG. 1), and a front wall (not visible in FIG. 1).

The inner enclosure 110 is lined with radio frequency absorbing material. In the embodiment shown in FIG. 1, the radio frequency absorbing material takes the form of pyramidal radio frequency absorbers 107 that are tiled on the inner surfaces of the inner enclosure 110. The pyramidal radio frequency absorbers 107 serve to reduce reflections and standing waves in the chamber 100.

A test stand 118 is located in the middle of the floor 112 of the inner enclosure 110. The test stand 118 is more fully described below with references to FIGS. 2–8. As shown in FIG. 1, the test stand 118 supports an EUT 122 (e.g., a cellular telephone) and a "phantom head" 120. The phantom head 120 is a hollow model of a human head that is filled with a fluid that is designed to approximate the electrical characteristics of a real person's head. A cellular telephone is typically operated while held adjacent to a user's head. Thus, the phantom head 120 is used to simulate the effect of a person's head on the radio frequency field generated by a cellular telephone. As shown, the cellular telephone EUT 122, is mounted to the phantom head 120. Rubber bands, packaging tape, adhesives or special mounts are suitable for attaching a cellular telephone EUT 122 to the phantom head 120. The phantom head 120 weighs about 10 kilograms. A phantom torso which is alternatively used weighs 30 kilograms. The test stand 118 must be strong enough to support this weight, and rigid enough to maintain the position of the phantom head and EUT during successive tests. There is a competing demand to use as little material as possible in the test stand 118 in order to limit the disturbance of radio frequency fields by the test stand 118.

A U-shaped swing arm 124 is disposed in the chamber 100. The swing arm 124 comprises a horizontal beam 126 that is connected perpendicularly at opposite ends to a first radial arm 128, and a second radial arm (not visible in FIG. 1). The horizontal beam 126 extends through a first arcuate slot 130 in the left wall 114 of the inner enclosure 110, and a congruently shaped second arcuate slot 132 in the right wall 116 of the inner enclosure 110. The first radial arm 128 is disposed between the right wall 116 of the inner enclosure 110 and the wall 108 of the outer skin 102. Similarly, the second radial arm (which parallels the first radial arm, but is not visible in FIG. 1) is disposed between the left wall 114 of the inner enclosure 110 and the outer skin 102. Ends of the two radial arms 128 remote from the horizontal beam 126 extend to a virtual pivot axis 134, about which the swing arm 124 rotates. The virtual pivot axis 134 intersects an axis 135 through the test stand 118. At the virtual pivot axis 134, the first radial arm 128 is connected to a first shaft 136, and the second radial arm (not shown) is coupled to a second shaft (not shown). The first shaft 136 extends through the outer skin 102 and is supported by a bearing 138. The second shaft (not shown) is suitably similarly supported. The first shaft 136 is coupled to a stepper motor 140 that is used to rotate the swing arm 124 and thereby control the polar angle of the horizontal beam 126 with respect to the EUT 122.

The horizontal beam 126 supports a measurement antenna 142 that is typically used to receive signals from the EUT 122. The measurement antenna 142 can be swung through a range of polar angles about the EUT 122 mounted on the test stand 118. Note that the range of polar angle to which the swing arm 124 can be rotated is limited at large polar angles by the finite transverse (depth) dimension of the test stand 118. However, the design of the test stand 118, which is described in more detail below with reference to FIGS. 2–8, allows the swing arm 124 to be rotated to large polar angles, thereby allowing radio frequency measurements of a substantial portion of solid angle about the EUT.

Although not shown in FIG. 1, the test stand 118 is suitably supported on a rotating device 504 (FIG. 5) located on the floor 112 of the inner enclosure 110, such that the azimuth of the test stand 118 carrying the EUT 122 can be varied relative to the measurement antenna 142. Thus, radio frequency signals emitted over a range of polar and azimuth angles can be measured in the chamber 100.

Radio frequency instrumentation 144 is located outside the chamber 100. The radio frequency instrumentation 144 suitably comprises a spectrum analyzer or other equipment suitable for making radio frequency power measurements. The radio frequency instrumentation 144 is coupled to the measurement antenna 142 through a cable (not shown) that runs along the swing arm 124. The radio frequency instrumentation 144 and/or the master controller 146 are alternatively also coupled to the EUT 122 through another cable (not shown) that runs up through the test stand 118.

A master controller 146 (e.g. a personal computer equipped with test instrument interfacing hardware and software) is coupled to the radio frequency instrumentation 144, the stepper motor 140, and to the rotating device 504 (FIG. 5) that controls the azimuth of the test stand 118. The master controller 146, although not essential, allows testing to be automated.

Figure 2:
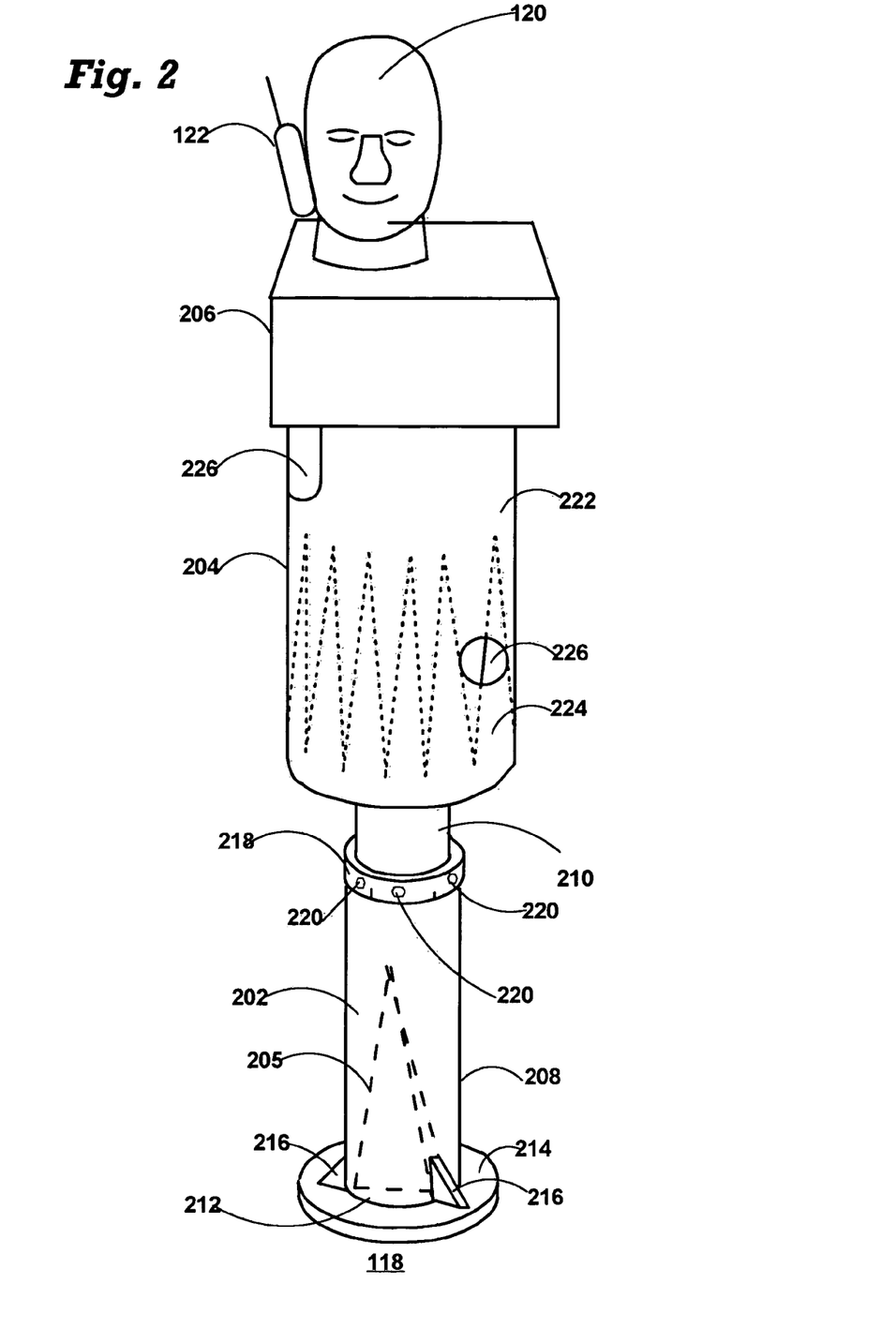
FIG. 2 is a partial x-ray view of a test stand used in the radio frequency anechoic test chamber shown in FIG. 1.
Figure 3:
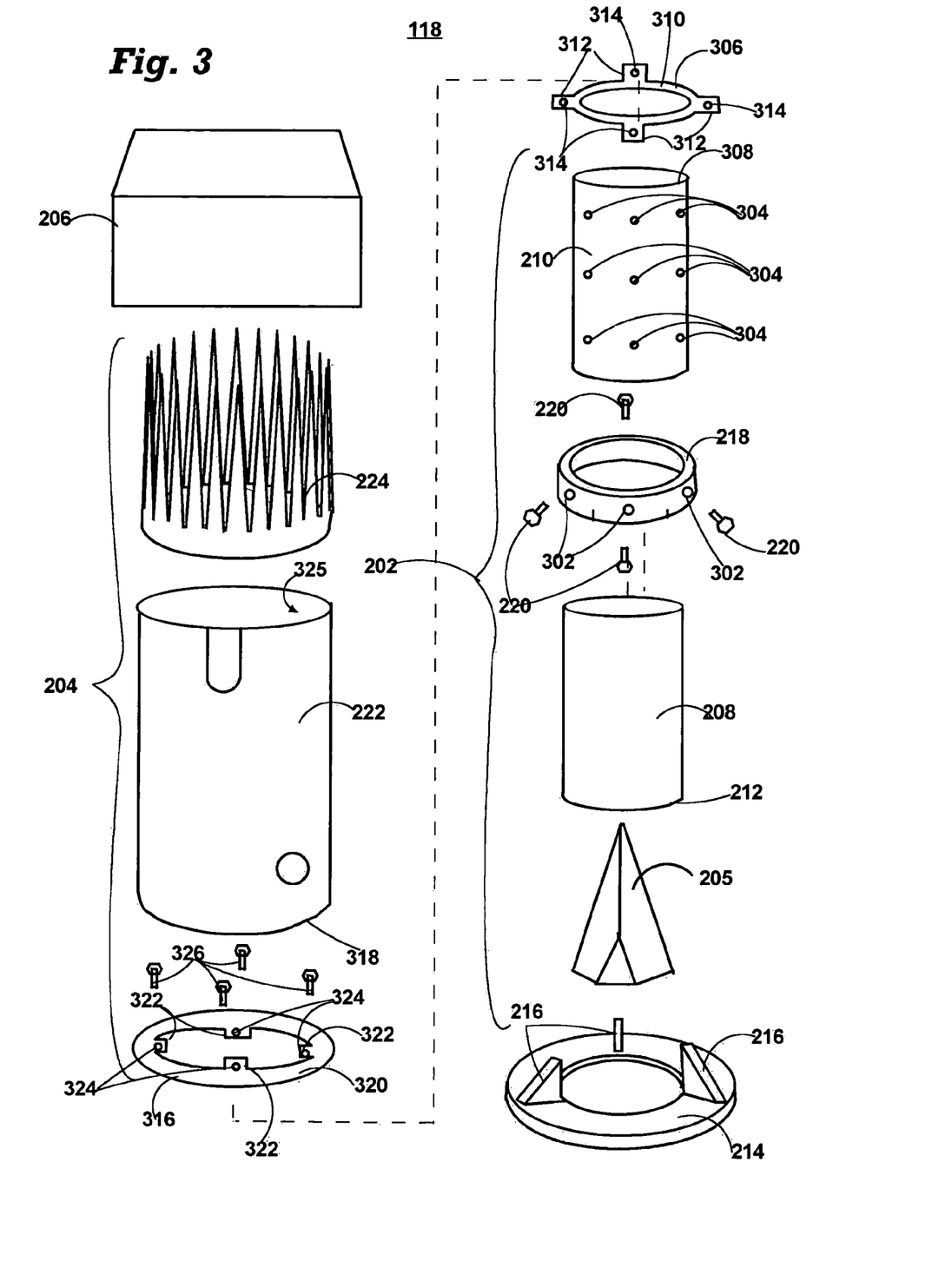
FIG. 3 is an exploded view of the test stand shown in FIG. 2.

FIG. 2 is a partial x-ray view of the test stand 118 used in the radio frequency anechoic test chamber 100 shown in FIG. 1, and FIG. 3 is an exploded view of the test stand 118 shown in FIG. 2. Referring to FIGS. 2–3, the test stand 118 comprises a lower vertical support column 202, a middle vertical support column 204, and an upper support member 206. The three major elements 202, 204, 206 that make up the test stand 118 each must meet specific performance requirements.

Figure 5:
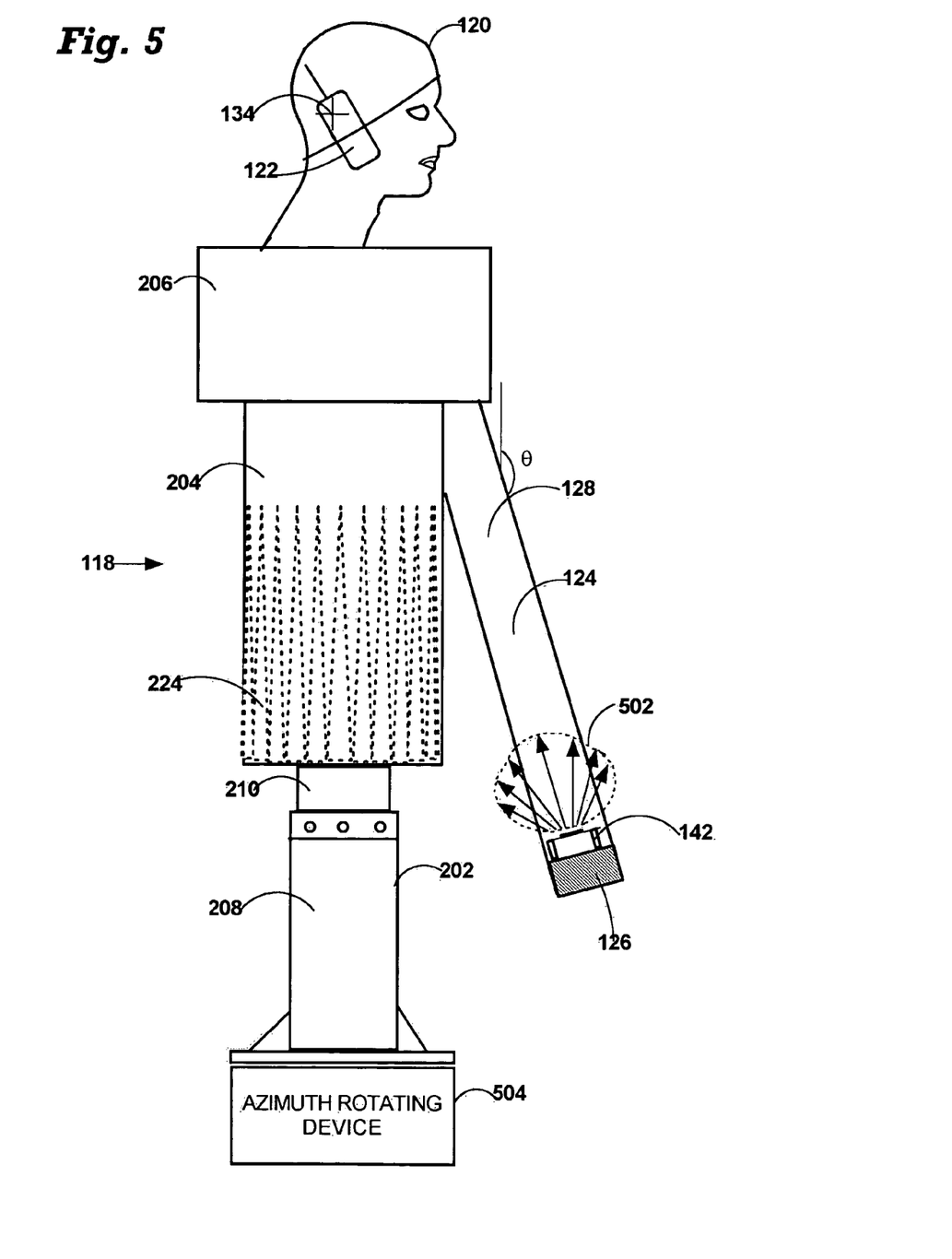
FIG. 5 is a partial x-ray side view of the test stand shown in FIGS. 2–3, along with half of a U-shaped swing arm used to support a measurement antenna in the radio frequency anechoic test chamber shown in FIG. 1.

The lower vertical support column 202 mechanically couples the test stand 118 to the azimuth rotating device 504 (FIG. 5). The lower vertical support column 202 must withstand torques produced by the azimuth rotating device 504 (FIG. 5). The lower vertical support column 202 is subject to the highest torques and weight loading. The potentially high level of stress indicates that a certain bulk of material be used to make the lower vertical support column 202 mechanically robust. On the other hand, it is desirable to make the transverse (depth) dimension of the lower vertical support column 202 small in order to reduce the degree to which mechanical interference with the test stand 118 limits the polar angle range of the swing arm 124. Reducing the transverse dimension tends to reduce the weight-bearing and torque-bearing capacity of the lower vertical support column 202. This can be compensated by using thicker section walled material in the lower support column 202, however doing so adds bulk which is to be avoided. The lower support column 202 is suitably circular in cross-section, but alternatively has a different cross-sectional shape. A height adjustment feature of the test stand 118 is also built into the lower vertical support column 202. The height adjustment feature allows EUTs and associated equipment e.g., a phantom head 120 or a phantom torso (not shown), of various heights to be aligned with the virtual pivot axis 134 of the swing arm 124. Adding a height adjustment feature also adds mass to the test stand 118, which should be limited in order to avoid disturbing radio frequency fields in the chamber 100. However, by incorporating the height adjustment feature into the lower vertical support column 202, and not extending the lower vertical support column 202 all the way up to the EUT 122, disturbance of the radio frequency fields is effectively greatly reduced. The lower vertical support column 202 will not typically subtend an angular range in which the gain of the measurement antenna 142 is high and is distant enough from the EUT 122 so as not to cause reflections of waves emitted from the EUT.

The aforementioned height adjustment feature is obtained by making the lower vertical support column 202 telescoping. The lower vertical support column 202 comprises a lower tube 208, and an upper tube 210. A bottom end 212 of the lower tube 208 is attached to a mounting flange 214 with the aid of a plurality of gussets 216. Adhesive is suitably used for coupling the lower tube 208, mounting flange 214, and gussets 216. The upper tube 210 is sized to fit into the lower tube 208. A dielectric collar 218 serves to set the insertion depth of the upper tube 210 into the lower tube 208 and thereby set the height of the test stand 118. The collar 218 includes a plurality of plain holes 302, and the upper tube has a plurality of corresponding sets of threaded holes 304. Dielectric screws 220 are passed through the plain holes 302 and threaded into one of the sets of threaded holes 304 in order to set the height of the test stand 118.

A pyramidal absorber 205 of the type used to line the chamber 100, but which has been trimmed at the base to fit within the lower tube 208, is positioned within the lower tube 208. The pyramidal absorber 205 in the lower vertical support column 202 serves to dampen interaction between the EUT 122, and the floor 106 of the outer skin 102 of the test chamber 100, which might otherwise degrade the ripple performance of the chamber 100.

A first connecting member 306 which is used in coupling the lower vertical support column 202 to the middle vertical support column 204, is affixed to an upper end 308 of the upper tube 210 of the lower vertical support column 202. The first connecting member 306 comprises an inner rim 310 and a first plurality of fingers 312 that radiate outward from the inner rim 310. There is an axially oriented threaded hole 314 in each of the first plurality of fingers 312.

The middle vertical support column 204 comprises a large diameter thin walled dielectric tube 222. The dielectric tube 222 is larger in diameter and has thinner walls than the upper 210 and lower 208 tubes of the lower vertical support column 202. Although as shown, the dielectric tube 222 has a circular cross-sectional shape, alternatively the dielectric tube 222 has a different cross-sectional shape. Practical dielectric materials that are suitable for constructing the test stand 118 (including the middle vertical support column 204) have, at radio frequencies, dielectric constants that exceed unity by a degree sufficient to potentially cause disturbances in radio frequency fields in the test chamber 100 and degrade the ripple figure of the test chamber 100. The inventors have found that by using a very thin walled tube 222, reflection of radio frequency waves that are associated with the middle vertical support column 204 are reduced. The thin walled tube 222 preferably has walls that are less than 1.5 mm thick (or less than 2% of the free space wavelength of waves emitted by the EUT 122). In order to maintain the requisite strength and stiffness to support the EUT 122 and any associated equipment e.g., the phantom head 120 or a phantom torso (not shown), the diameter of the thin walled tube 222 is increased. The diameter of the thin walled tube 222 is preferably at least 30 centimeters. The thin walled tube is suitably made of fiberglass. However, increasing the diameter of the thin walled tube 222 places the thin walled tube 222 in the direct line of sight between the measurement antenna 142 and the EUT 122 at large polar angles of the swing arm 124 which tends to degrade the ripple of the test chamber 100. It is believed that this degradation is due to the fact that the thin walled tube partially reflects waves emitted at high polar angles by the EUT.

Figure 4:
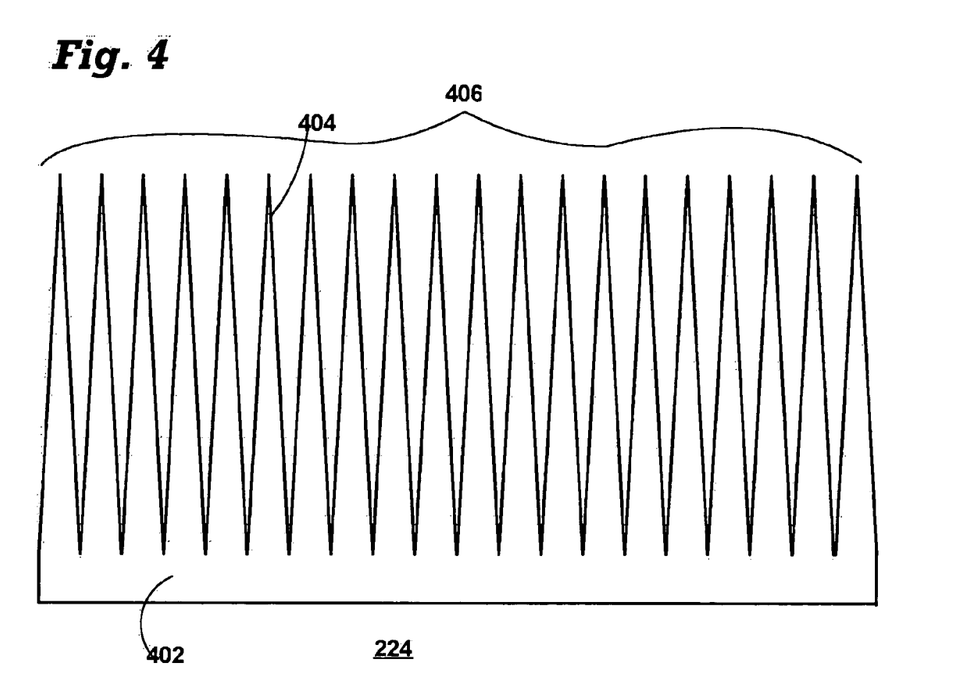
FIG. 4 is a plan view of a radio frequency absorber used in the test stand shown in FIGS. 2–3 in an unrolled state.

The middle vertical support column 204 also includes a sheet of radio frequency absorbing material 224 that is rolled up into a tube and fitted inside the thin wall tube 222, along an inside cylindrical surface 325 of the thin walled tube 222. FIG. 4 shows the sheet of absorbing material 224 in an unrolled state. As shown in FIG. 4, the absorbing material 224 comprises a solid lower band of material 402 and an upper edge 404 that includes a series of tapered portions 406 extending upward from the solid band of material 402. In the embodiment shown in FIG. 4, the tapered portions 406 are triangular. Alternatively, nonlinear tapered portions are provided. The absorbing material 224 is suitably one-half to two-thirds the height of the thin walled tube 222. Although it might reasonably be expected that inclusion of the absorbing material would preferentially absorb radio frequency waves emitted by the EUT at large polar angles (angles close to the direction of the absorbing material relative to the EUT) and thereby degrade the ripple performance, in practice the absorbing material 224 included in the middle vertical support column 204 improves ripple performance. The design of the absorbing material 224 shown in the FIGS. 2-4 balances two physical effects on the ripple. The first physical effect is that inclusion of the absorbing material 224 tends to attenuate waves directed at large polar angles. The latter physical effect would appear to contraindicate the inclusion of the absorbing material 224. The second physical effect, which is believed to account for the improved ripple performance obtained with the absorbing material notwithstanding the first physical effect, is that the absorbing material 224 attenuates reflections of electromagnetic waves associated with the middle vertical support column 204. These reflections degrade ripple performance. However, too much absorber would increase the first physical effect and degrade ripple performance. The tapered design shown in FIGS. 2–4 has proved to strike a good balance between these competing effects. Other designs that decrease the amount or strength of the absorber as a function of height along the middle vertical support column 204 are alternatively used. Examples of alternatives include a pattern of dots or other shapes of decreasing density (number per unit area), or a pattern of dots or other shapes of decreasing size. The absorbing material 224 is suitably made from a cut sheet of carbon loaded open cell foam or another type of radio frequency absorbing material. Alternatively, in lieu of a self supporting sheet, a coating of radio frequency absorbing material is used. Although a particular working theory of the invention is presented herein, the invention should not be construed as limited by the particular theory.

The thin walled tube 222 includes a plurality of openings 226 that can be used to run cables for test setups in which it is desired to couple signals to or from the EUT 122.

A second connecting member 316 that is used in coupling the lower vertical support column 202 to the middle vertical support column 204 is affixed to a lower end 318 of the thin walled tube 222 of the middle vertical support column 204. The second connecting member 316 comprises an outer rim 320, and a second plurality of fingers 322 that extend radially inward from the outer rim 320. There is an axially oriented plain hole 324 in each of the second plurality of fingers 322. In order to couple the lower vertical support column 202 to the middle vertical support column 204 a plurality of dielectric bolts 326 are passed through the plain holes 324 in the second connecting member 316 and threaded into the threaded holes 314 in the first connecting member 306. The two connecting member 306, 316 are dielectric and are suitably connected to the respective vertical support columns 202, 204 using a strong adhesive. When the connecting members 306, 316 are connected there will be a plurality annular slots defined between the inner rim 310, the outer rim 320, and the overlapping first 312 and second 322 pluralities of fingers.

The upper support member 206 is closest to the EUT 122, and consequently has the greatest potential to perturb fields emitted by the EUT, or degrade ripple performance of the chamber 100. However, in as much as the upper support member 206 is suitably relatively short, the requirement for bending strength and stiffness in order to withstand unbalanced loads of the EUT, and associated equipment, is not of great concern. A material which ably meets the requirements for the upper support member is expanded polystyrene. Expanded polystyrene has a dielectric constant close to unity so that it will have a relatively small perturbative effect on a radio frequency field in the test chamber 100 and has sufficient structural integrity given the short length of the upper support member 206 to support the weight of the EUT 122 and associated apparatus, e.g. phantom head 120, or a phantom torso (not shown). As shown in FIGS. 2–3, the upper support member 206 is hexahedron shaped. Alternatively the upper support member 206 has a different shape.

FIG. 5 is a partial x-ray side view of the test stand 118 shown in FIGS. 2–3, along with half of the U-shaped swing arm 124 used to support the measurement antenna 142 in the radio frequency anechoic test chamber 100. The polar gain pattern of the measurement antenna 142 is schematically indicated at 502. As shown in FIG. 5, the swing arm 124 is rotated to a large polar angle, θ. As can be seen in FIG. 5, when the swing arm 124 is rotated to high polar angles, the middle vertical support column 204 subtends a solid angular range about the measurement antenna 142 in which the gain of the measurement antenna 142 is high. Additionally, the middle vertical support column 204 is in the direct line of sight between the EUT 122 and the measurement antenna 142. Nonetheless, it has been found that good ripple performance is obtained using the test stand 118 constructed as described herein.

The test stand 118 is shown in FIG. 5 supported on the azimuth rotating device 504, which is represented schematically.

Figure 6:
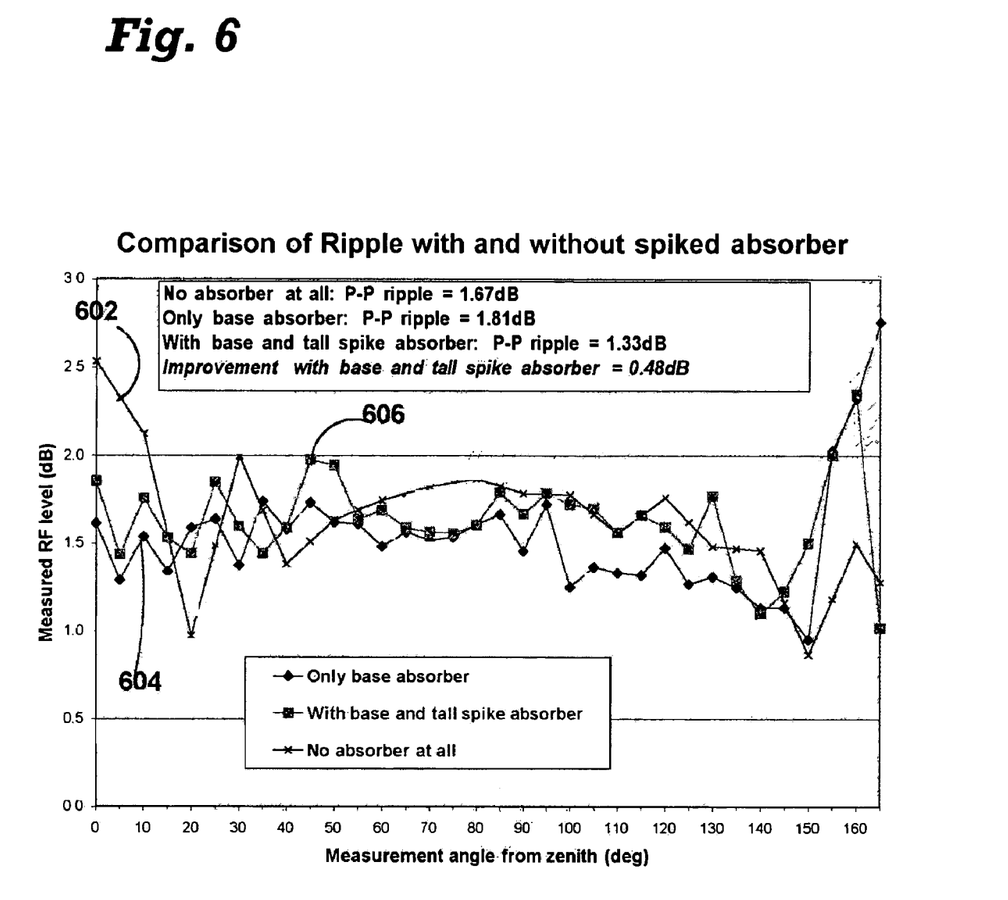
FIG. 6 is graph showing ripple measurements for various test stands.

FIG. 6 is graph showing ripple measurements for various test stands. In the graph the abscissa indicates polar angle and is marked off in intervals of ten degrees. The ordinate indicates the level of signal measured by the measurement antenna 142, and is marked off in intervals of 0.5 dB. As previously mentioned the ripple measurement is made with a transmitting antenna that is designed to radiate uniformly as a function of polar angle. In the graph, plot 602 is the ripple measurement for the test stand 118, without the pyramidal absorber 205 in the lower vertical support column 202 and without the absorbing material 224 in the middle vertical support column 204. The signal level varies from a high of about 2.5 dB at 0 degrees, to a low of 0.8 dB at 150 degrees, giving a peak-to-peak ripple of about 1.7 dB. Plot 604 is the ripple measurement for the test stand 118 with the pyramidal absorber 205, but without the absorbing material 224. The signal level abruptly varies from a low of 0.95 dB at 150 degrees to a high of 2.75 dB at 165 degrees, giving a worse peak-to-peak ripple of 1.8 dB. Plot 606 is the ripple measurement for the test stand 118, with both the pyramidal absorber 205 in the lower vertical support column 202 and the absorbing material 224 in the middle vertical support column 204. In this case the signal level varies from a high of 2.4 dB at 160 degrees to a low of 1.05 dB at 165 degrees, yielding an improved peak-to-peak ripple measurement of 1.35 dB.

Figure 7:
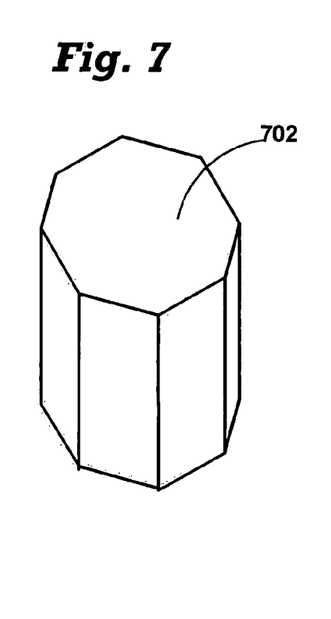
FIG. 7 is an octagonal prism-shaped upper support of the test stand shown in FIGS. 2–3, 5 according to an alternative embodiment.

FIG. 7 is an octagonal prism shaped upper support member 702 of the test stand 118 shown in FIGS. 2–3, 5 according to an alternative embodiment.

Figure 8:
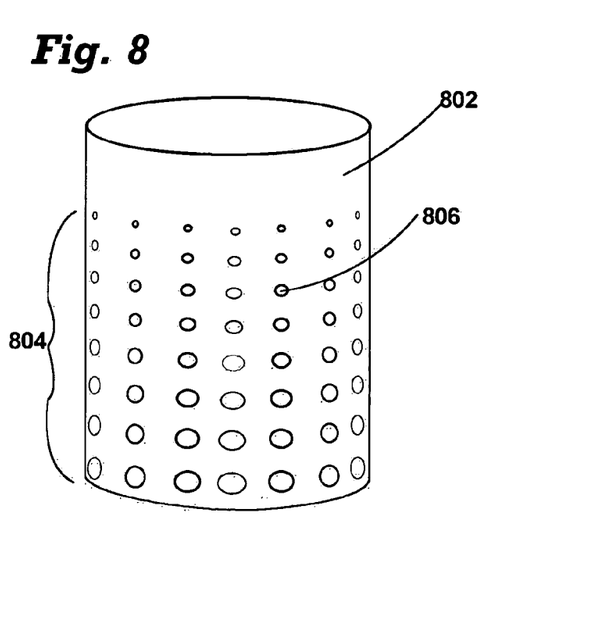
FIG. 8 is a thin walled tube of the test stand shown in FIGS. 2–3, 5 according to an alternative embodiment.

FIG. 8 is a thin walled tube 802 of the test stand shown in FIGS. 2–3,5 according to an alternative embodiment. A pattern 804 of circular patches 806 of radio frequency absorber is supported on the thin walled tube 802. In the pattern 804, the amount of absorber per unit height is decreased by decreasing the size of the circular patches 806 as a function of height.

While the preferred and other embodiments of the invention have been illustrated and described, it will be clear that the invention is not so limited. Numerous modifications, changes, variations, substitutions, and equivalents will occur to those of ordinary skill in the art without departing from the spirit and scope of the present invention as defined by the following claims.

The invention is claimed is:

1. A radio frequency anechoic chamber comprising:
   a test stand comprising:
   a first vertical support column, said first vertical support column comprising one or more radio frequency absorbers in a tube shape with tapered protrusions distributed over, at least, a longitudinally extended portion of said first vertical support column.

2. The radio frequency anechoic chamber according to claim 1 wherein said one or more radio frequency absorbers comprise carbon filled open cell foam.

3. The radio frequency anechoic chamber according to claim 1 wherein:
   said one or more radio frequency absorbers are disposed proximate a periphery of said first vertical support column.

4. The radio frequency anechoic chamber according to claim 3 wherein:
   said one or more radio frequency absorbers are distributed over an area that extends proximate, at least, a substantial portion of a circumference of the first vertical support column.

5. The radio frequency anechoic chamber according to claim 4 wherein:
   said one or more radio frequency absorbers comprises a layer of radio frequency absorbing material.

6. The radio frequency anechoic chamber according to claim 5, wherein:
   said tapered protrusions extend substantially longitudinally with respect to said first vertical support column.

7. The radio frequency anechoic chamber according to claim 5, wherein:
   said one or more radio frequency absorbers are present in an amount of absorber per unit height that decreases as a function of height along the first vertical support column.

8. The radio frequency anechoic chamber according to claim 4 wherein:
   said first vertical support column comprises a first hollow tubular member; and said one or more radio frequency absorbers are disposed within said first hollow tubular member.

9. The radio frequency anechoic chamber according to claim 8 wherein:
the first hollow tubular member is circular in cross section.

10. The radio frequency anechoic chamber according to claim 8 wherein:
the first hollow tubular member comprises a fiberglass tube.

11. The radio frequency anechoic chamber according to claim 8 wherein:
said one or more radio frequency absorbers comprise a layer of radio frequency absorbing material.

12. The radio frequency anechoic chamber according to claim 11, wherein:
said tapered protrusions extend substantially axially with respect to first vertical support column.

13. The radio frequency anechoic chamber according to claim 10, wherein:
the fiberglass tube has a diameter of at least 30 centimeters, and a wall thickness of less than 1.5 millimeters.

14. The radio frequency anechoic chamber according to claim 8 wherein:
said test stand comprises a second vertical support column, disposed below said first vertical support column, in supporting relation to said first vertical support column, wherein said first vertical support column is characterized by a first transverse dimension, and said second vertical support column is characterized by a second transverse dimension, and said second transverse dimension is less than said first transverse dimension, whereby said first vertical support column overhangs said second vertical support column.

15. The radio frequency anechoic chamber according to claim 14 further comprising:
a swing arm adapted to support a measurement antenna, and swing through a range of polar angle about a first axis that that intersects an axis through said test stand, wherein, at large polar angles said swing arm comes near to said second vertical support column, and in such orientations, positions said measurement antenna to view an equipment under test antenna disposed above said first vertical support column, wherein a line of sight between said measurement antenna and said equipment under test antenna intersects said first vertical support column.

16. The radio frequency anechoic chamber according to claim 14 further comprising:
a third vertical support disposed above, and supported by said first vertical support column.

17. The radio frequency anechoic chamber according to claim 16 wherein said third vertical support comprises expanded polystyrene.

18. The radio frequency anechoic chamber according to claim 16 further comprising:
a radio frequency test model disposed above, and supported by said third vertical support.

19. The radio frequency anechoic chamber according to claim 14 further comprising:
a first connecting member having a first rim, and a first plurality of fingers extending radially inward from said first rim, wherein said first rim is attached to a lower end of said first vertical support column; and
a second connecting member having a second rim, and a second plurality of fingers extending radially outward from said second rim, wherein said second rim is attached to an upper end of said second vertical support column, and said first and second plurality of fingers are disposed in overlapping relation.

20. A radio frequency anechoic chamber comprising:
a test stand comprising:
a first vertical support column, said first vertical support column comprising one or more radio frequency absorbers in a tube shape with tapered protrusions disposed proximate a periphery of said first vertical support column.

21. The radio frequency anechoic chamber according to claim 20 wherein said one or more radio frequency absorbers comprise carbon filled open cell foam.

22. A stand for supporting radio frequency equipment under test in an anechoic test chamber, the stand comprising:
a vertical support column; and
one or more radio frequency absorbers in a tube shape with tapered protrusions distributed over, at least, a longitudinally extended portion of said vertical support column.

23. The stand according to claim 22, wherein:
said one or more radio frequency absorbers are present in an amount of absorber per unit height that decreases as a function of height along the vertical support column.

24. The stand according to claim 22 wherein:
said vertical support column comprises a hollow tubular member; and
said one or more radio frequency absorbers are disposed within said hollow tubular member.

25. The stand according to claim 22 wherein:
said one or more radio frequency absorbers are disposed proximate a periphery of said vertical support column.

26. The stand according to claim 25 wherein:
said one or more radio frequency absorbers comprises a layer of radio frequency absorbing material.

* * * * *